(12) United States Patent
Magee et al.

(10) Patent No.: US 8,453,096 B2
(45) Date of Patent: May 28, 2013

(54) NON-LINEAR COMMON COARSE DELAY SYSTEM AND METHOD FOR DELAYING DATA STROBE

(75) Inventors: Terence J. Magee, San Francisco, CA (US); Christopher D. Paulson, Fort Collins, CO (US); Cheng-Gang Kong, Saratoga, CA (US)

(73) Assignee: LSI Corporation, San Jose, CA (US)

( * ) Notice: Subject to any disclaimer, the term of this patent is extended or adjusted under 35 U.S.C. 154(b) by 201 days.

(21) Appl. No.: 13/016,472

(22) Filed: Jan. 28, 2011

(65) Prior Publication Data

US 2012/0194248 A1 Aug. 2, 2012

(51) Int. Cl.
*G06F 17/50* (2006.01)

(52) U.S. Cl.
USPC .......................................................... 716/132

(58) Field of Classification Search
USPC .................................................. 716/100, 132
See application file for complete search history.

(56) References Cited

U.S. PATENT DOCUMENTS

| | | | |
|---|---|---|---|
| 6,812,760 B1 | 11/2004 | Kim et al. | |
| 6,868,504 B1 | 3/2005 | Lin | |
| 7,454,303 B2 | 11/2008 | Magee et al. | |
| 7,571,396 B2 | 8/2009 | Hughes et al. | |
| 2004/0145423 A1* | 7/2004 | Kirsch | 331/57 |
| 2008/0068911 A1* | 3/2008 | Hughes et al. | 365/211 |
| 2009/0119532 A1* | 5/2009 | Newcomb et al. | 713/401 |
| 2010/0039875 A1* | 2/2010 | Stott et al. | 365/193 |
| 2010/0134166 A1* | 6/2010 | Kwak | 327/158 |

* cited by examiner

*Primary Examiner* — Suchin Parihar
(74) *Attorney, Agent, or Firm* — Kermit D. Lopez; Luis M. Ortiz; Ortiz & Lopez, PLLC

(57) ABSTRACT

A non-linear common coarse delay system and method for delaying a data strobe in order to preserve fine delay accuracy and compensate PVT (Process, Voltage, and Temperature) variation effects. A common coarse delay and a fine delay can be initialized to a quarter-cycle delay for shifting a read output DQS (Data Queue Strobe) associated with a memory device in order to sample a read output DQ (Data Queue) within a physical layer. The fine delay can be programmed from minimum to maximum delay with fixed linear increments at each delay step in order to determine the resolution and accuracy of the delay. An optimum delay size of both the coarse and the fine delay can be determined based on an application slowest frequency of operation. A spare coarse delay and a functional coarse delay can be trained in association with a spare fine delay and the functional fine delay can be updated in order to monitor the process, voltage, and temperature variation effects.

18 Claims, 5 Drawing Sheets

US 8,453,096 B2

NON-LINEAR COMMON COARSE DELAY SYSTEM AND METHOD FOR DELAYING DATA STROBE

TECHNICAL FIELD

Embodiments are generally related to electronic data storage systems and methods. Embodiments are also related to a physical layer solution for sampling read data from a source synchronous memory. Embodiments are additionally related to systems and methods for delaying a data strobe. Embodiments are further related to the compensation of PVT (Process, Voltage, and Temperature) effects.

BACKGROUND OF THE INVENTION

High-speed synchronous systems generally require a tightly controlled clock timing allowance for high performance operation. With source-synchronous interfaces, data and clock transport from a transmitter to a receiver, and the receiver interface employs the clock to latch the accompanying data. The device that transmits data also generates a data strobe signal that travels toward the receiving device along with the data signals. Such source-synchronous signaling eliminates problems associated with common clock systems such as propagation delay, clock skew, etc., thereby increasing the maximum operating frequency.

Source synchronous memory interfaces such as, for example, DDR (Double-Data-Rate) and source synchronous NAND Flash interfaces require a quarter cycle delay shifting of the read output DQS (Data Queue Strobe) coming from the memory device in order to robustly sample a read output data queue (DQ) within a PHY (Physical Layer). Accurate sampling of the read output data by the read output data strobe may require four linearly programmable delays for independently delaying the rising and falling edges of the read output data strobe and independently sampling a read output data byte into an upper and lower nibble to minimize skew effects. As frequency of operation decreases, the quarter-cycle delay increases and consequently the area overhead of four delays cells becomes a large percentage of the overall PHY area. Hence a solution is required to delay the read DQS from the flash device by a quarter cycle of its period in order to correctly sample the read data, DQ memory over a wide range of clock frequencies without the large area impact.

Conventionally, multiple fine delays are employed for achieving the optimum delay size. Such fine delays require large delay cells to achieve both the bulk delay and the fine granularity. Additionally, the fine delay must be pre-constructed utilizing either discrete gates or many simple standard cells such as, for example, NAND gates, which can be time consuming to construct such a delay that can maintain linearity (uniform delay steps) across its entire range. Furthermore, prior art methods only address PVT (Process, Voltage, Temperature) compensation of the fine delays or of a standalone coarse plus fine delay that combine to be a single linearly incrementing delay. A solution is required to address the PVT compensation of a standalone coarse plus fine delay that are not required to combine to be a single linearly incrementing delay.

Based on the foregoing, it is believed that a need exists for an improved non-linear common coarse delay system and method for delaying a data strobe to preserve fine delay accuracy and to compensate PVT variation effect. A need also exists for an improved method for determining a correct coarse and fine delay size based on frequency and expected PVT variation, as described in greater detail herein.

BRIEF SUMMARY

The following summary is provided to facilitate an understanding of some of the innovative features unique to the disclosed embodiments and is not intended to be a full description. A full appreciation of the various aspects of the embodiments disclosed herein can be gained by taking the entire specification, claims, drawings, and abstract as a whole.

It is, therefore, one aspect of the disclosed embodiments to provide for an improved system and method for providing a physical layer solution to sample read data from a source synchronous memory.

It is another aspect of the disclosed embodiments to provide for an improved non-linear common coarse delay system and method for delaying a data strobe utilizing a common coarse delay and a fine delay to a quarter-cycle delay in order to preserve fine delay accuracy.

It is further aspect of the disclosed embodiments to provide for an improved system and method for determining an optimum delay size of both the coarse and fine delay for slowest frequency of operation.

It is yet another aspect of the present invention to provide for an improved method for compensating PVT (Process, Voltage, Temperature) variation of the combination of the coarse bulk delay and the fine delay.

The aforementioned aspects and other objectives and advantages can now be achieved as described herein. A non-linear common coarse delay system and method for delaying a data strobe in order to preserve fine delay accuracy and compensate PVT variation effects is disclosed herein. A common coarse delay and a fine delay can be initialized to a quarter-cycle delay for shifting a read output DQS (Data Queue Strobe) associated with a memory device in order to sample a read output DQ (Data Queue) within a physical layer. The fine delay can be programmed from minimum to maximum delay with fixed linear increments at each delay step in order to determine the resolution and accuracy of the delay. An optimum delay size of both the coarse and the fine delay can be determined based on an application slowest frequency of operation. A spare coarse delay and a functional coarse delay can be trained in association with a spare fine delay and the functional fine delay can be updated in order to monitor process, voltage, and temperature variation effects.

The coarse delay can be bypassed at higher frequency and the fine delay can be employed for delaying the data strobe. The minimum delay required in the fine delay can be determined in order to address the voltage and temperature compensation. The acquired minimum delay can be added to a coarse increment delay for determining a cutoff point. One or more cutoff delay taps can be set based on a fast process corner so that the cutoff delay is at least one coarse increment greater than the minimum delay. Furthermore, a fine delay limit can be determined by summing the minimum delay to the cutoff point in order to calculate the size of the common coarse delay.

The training algorithm can be performed by determining a quarter setting for a spare fine delay as calibrated through the functional coarse delay. A quarter setting for spare fine delay can be determined as calibrated through spare coarse delay. The spare fine delay with respect to the functional coarse delay can be subtracted from the spare fine delay with respect to the spare coarse delay in order to determine a coarse delay difference in fine delay steps between the functional coarse delay and the spare coarse delay. The ratio of the functional fine delay to the spare fine delay calibrated through the functional coarse delay can be calculated. The training can be executed only through the spare path in the functional mode for tracking the PVT variation. The training for calibrating spare fine delay through the spare coarse delay can be repeated overtime in order to generate various results for the spare fine delay. The update for each functional fine delay can be calculated utilizing the coarse delay difference between functional coarse delay and spare coarse delay, the calculated ratios between functional fine delays and spare fine delays and the generated spare fine delay calibrated via spare coarse delay.

The common coarse delay can be employed to achieve the bulk of the delay with minimum area overhead and the fine delays are smaller and provide the accuracy. The common coarse delay possess large delay steps with no requirement for a linear continuity of delay increments from the fine delays to the coarse delay in order to greatly simplify the construction of the coarse delay. Such an approach increases the range of the quarter cycle delay on the DQS with minimum area overhead by using the common coarse delay that can be made up of inaccurate but area dense components.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

DETAILED DESCRIPTION

The particular values and configurations discussed in these non-limiting examples can be varied and are cited merely to illustrate at least one embodiment and are not intended to limit the scope thereof.

The embodiments now will be described more fully hereinafter with reference to the accompanying drawings, in which illustrative embodiments of the invention are shown. The embodiments disclosed herein can be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
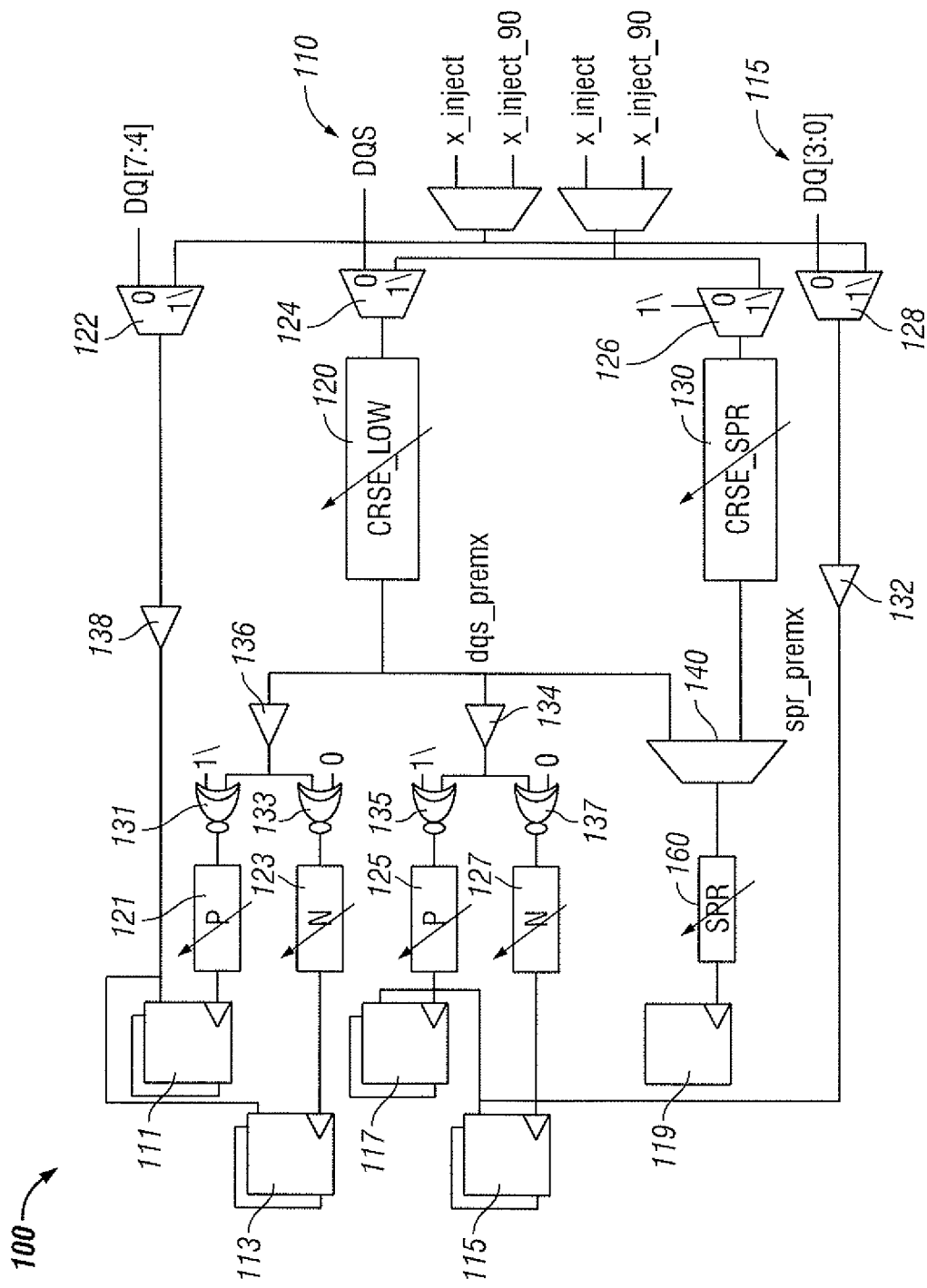
FIG. 1 illustrates a circuit diagram of a non-linear common coarse delay system for delaying a data strobe in order to preserve fine delay accuracy and to compensate PVT (Process, Voltage, and Temperature) variation effects, in accordance with the disclosed embodiments.

FIG. 1 illustrates a circuit diagram of a non-linear common coarse delay system 100 for delaying a data strobe in order to preserve fine delay accuracy and to compensate process, voltage, and temperature (PVT) variation effect, in accordance with the disclosed embodiments. The system 100 generally includes a number of logic components, devices and interfaces including for example, components 122, 124, 126 and 128 and a spare coarse delay 130 and a functional coarse delay 120. Other components include functional fine delays 121, 123, 125, and 127, which are respectively connected to gates 131, 133, 135 and 137. A spare fine delay 160. A buffer 136, for example, can be connected to both logic gates 131 and 133, while a buffer 134 can be connected to logic gates 135 and 137. System 100 also includes, for example, registers 111, 113, 115, 117, and 119 along with, for example, a fixed delay 132 an inverter 132 located between component 128 and register 115. Another fixed delay 138 can be located between, for example register 111 and component 122.

The non-linear common coarse delay system 100 can provide a quarter-cycle delay for a synchronous memory interface such as, for example, a DDR (Dual Data Rate) and source synchronous NAND flash interfaces. Note that the embodiments discussed hereinafter generally relate on an implementation of the invention in a synchronous dynamic random access (SDRAM) environment, in particular a double data rate (DDR) SDRAM memory interface between an application chip such as a memory controller and one or more DDR SDRAM memory devices. In such an environment, the data strobe signal is referred to as DQS, while the data lines are referred to as DQ. It can be appreciated, however, that such embodiments can be implemented in the context of other memory interface environments other than SDRAM environments, as well as in source synchronous communication environments other than memory interface environments.

As indicated in FIG. 1, 1x_inject and 1x_inject_90 are periodic strobes having the same period as the DQS. They are derived from a clk2x, which is half the period of DQS. 1x_inject is divided down by 2 off the rising clk2x and 1x_inject_90 is divided down by 2 off the falling clk2x. As a result 1x_inject and 1x_inject_90 are shifted in phase by a quarter cycle.

The common coarse delay system 100 can be configured with one or more multiplexers and XNOR gates. The multiplexers perform multiplexing, a process for combining multiple signals into one signal over a shared medium. The non-linear common coarse delay system 100 can initialize a common coarse delay and a fine delay to the quarter-cycle delay for shifting the DQS signal 110 associated with a memory device in order to sample DQ 115 within a physical layer. Note that the coarse delay can be bypassed at higher frequency and the fine delay can be employed for delaying the data strobe.

The large linear-step delay cells can break into smaller linear-step delay cells (fine delay) and a common coarse delay for the bulk of the delay. The fine delay can be programmed from minimum to maximum delay with fixed linear increments at each delay step in order to determine the resolution and accuracy of the delay. An optimum delay size of both the coarse and the fine delay can be determined based on an application's slowest frequency of operation. A spare coarse delay 130 and a functional course delay 120 can be trained in association with a spare fine delay and the functional fine delay can be updated to monitor process, voltage, and temperature variation effects. The common coarse delay system 100 can be employed to achieve the bulk of the delay with minimum area overhead and the fine delays that are smaller in order to provide the accuracy.

Figure 2:
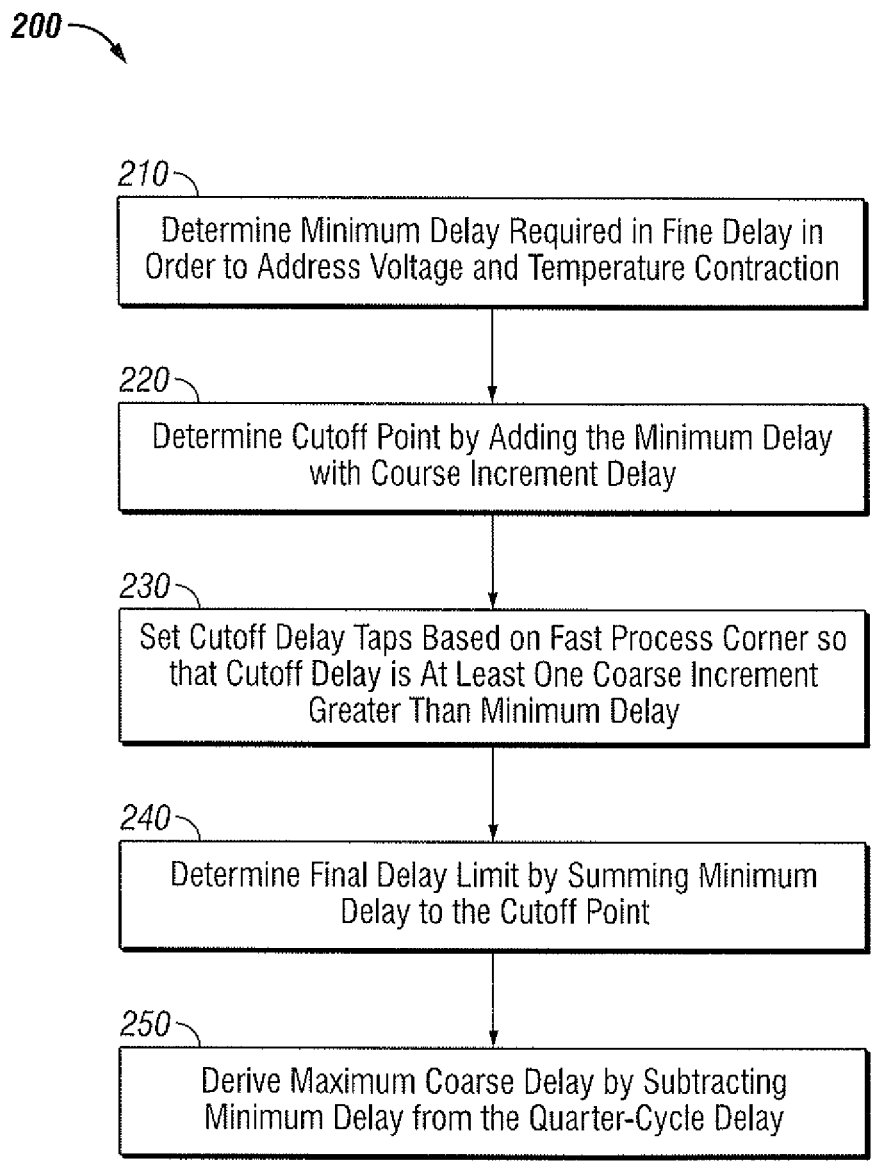
FIG. 2 illustrates a high level flow chart of operations illustrating logical operational steps of a method for calculating a delay size of a coarse and fine delay based on an application slowest frequency of operation, in accordance with the disclosed embodiments.
Figure 3:
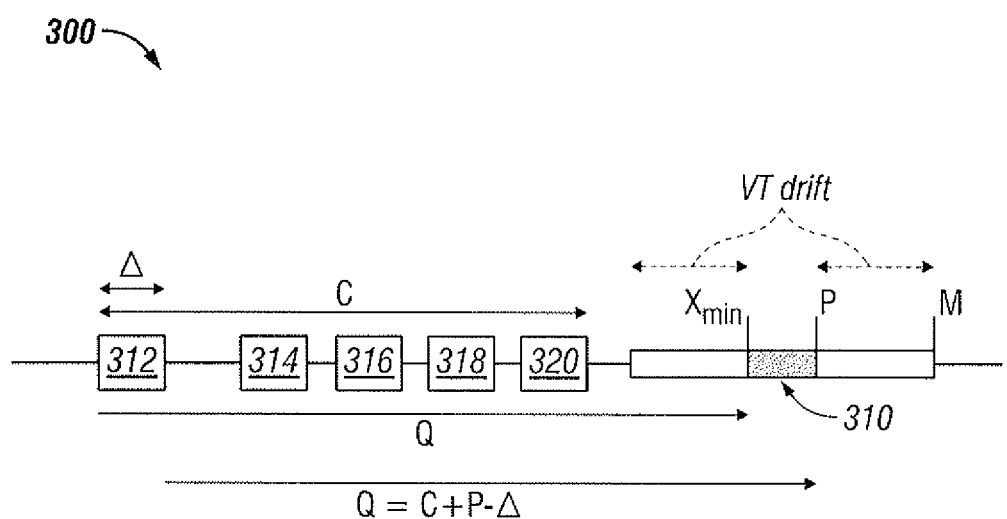
FIG. 3 illustrates a timing diagram for calculating the delay size of the coarse and fine delay, in accordance with the disclosed embodiments.

FIG. 2 illustrates a high level flow chart of operations illustrating logical operational steps of a method 200 for calculating the common coarse delay size, in accordance with the disclosed embodiments. The minimum delay ($X_{min}$) required in a fine delay can be determined in order to address voltage and temperature compensation, as illustrated at block 210. As illustrated in FIG. 3, the minimum delay can be determined, as also indicated by equation (1) below.

$$X_{min} = Q*VT \quad (1)$$

Where, Q represents the quarter-cycle delay that can be obtained by adding the coarse delay (C) and $X_{min}$ as indicated in equation (2) as follows:

$$Q = C + X_{min} \quad (2)$$

One or more $X_{min}$ taps can be set on the fine delay utilizing a fast process. A cutoff point can be determined by adding the minimum delay with a coarse increment delay 310, as depicted at block 220. (Note that the such a coarse increment can be represented by any of square blocks 312, 314, 316, 318 and 320 depicted in FIG. 3) The cutoff point can be determined by the following equation (3):

$$P = X_{min} + \Delta fast \quad (3)$$

One or more P taps can be set based on a fast process corner so that the cutoff delay is at least one coarse increment greater than the minimum delay to ensure that the fine delay select do not end up less than $X_{min}$ after training, as indicated at block 230. A fine delay limit, M, can be further determined by summing the minimum delay to the cutoff point P, as illustrated at block 240. The fine delay limit, M, can be determined by adding an extra margin of $X_{min}$ up to M in order to settle at P in a slow corner as illustrated below in equation (4).

$$M = P + X_{min} \quad (4)$$

Thereafter, the maximum coarse delay size ($C_{max}$) can be calculated by subtracting minimum delay from quarter-cycle delay, as depicted at block 250. The bulk size of the coarse delay can be derived from the equation as follows:

$$Cmax = Q - X_{min} \quad (5)$$

The cut-off point, P can be necessary only when the coarse delay is utilized. In cases of higher frequency such as, DDR, the coarse delays can be bypassed in order to utilize the fine delay. Thus the coarse delay can be initialized to a quarter-cycle delay for read output data queue strobe (DQS) 110 associated with a memory device in order to sample the read output data queue (DQ) 115 within a physical layer. The common coarse delay possess large delay steps with no requirement for a linear continuity of delay increments from the fine delays to the coarse delay in order to greatly simplify the construction of the coarse delay. Such a system can increase the range of the quarter cycle delay on the DQS 110 with minimum area overhead by using the common coarse delay that can be made up of inaccurate but area dense components. Such a system guarantees that after initial training the fine delay settings will be between Xmin and P. During tracking, the fine delays may be moved between 0 and M to compensate for VT variation of the sum of the coarse and fine delay.

Figure 4:
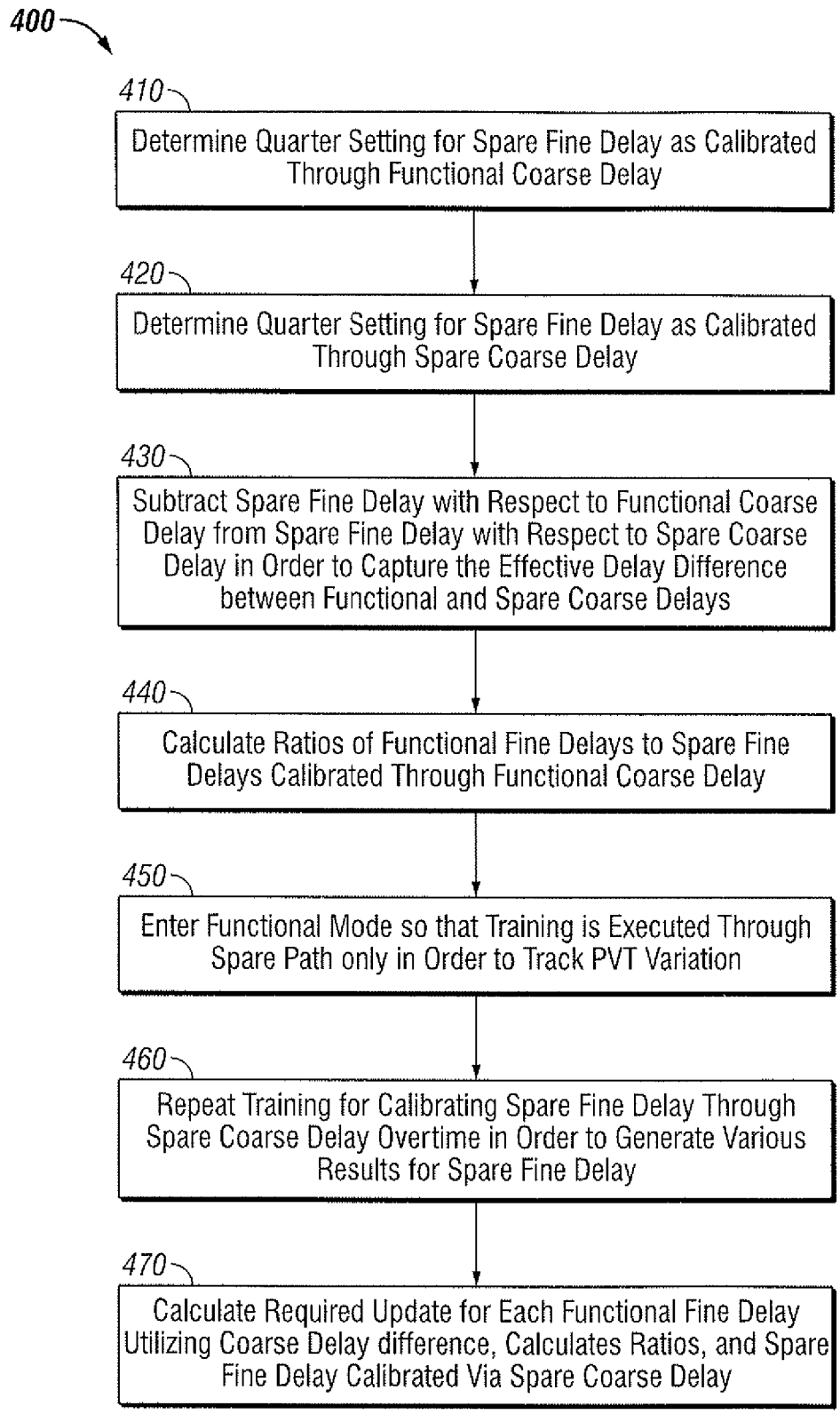
FIG. 4 illustrates a high level flow chart of operations illustrating logical operational steps of a method for training a spare coarse delay and a functional coarse delay in association with a spare fine delay and updating a functional fine delay to monitor PVT variation, in accordance with the disclosed embodiments.
Figure 5:
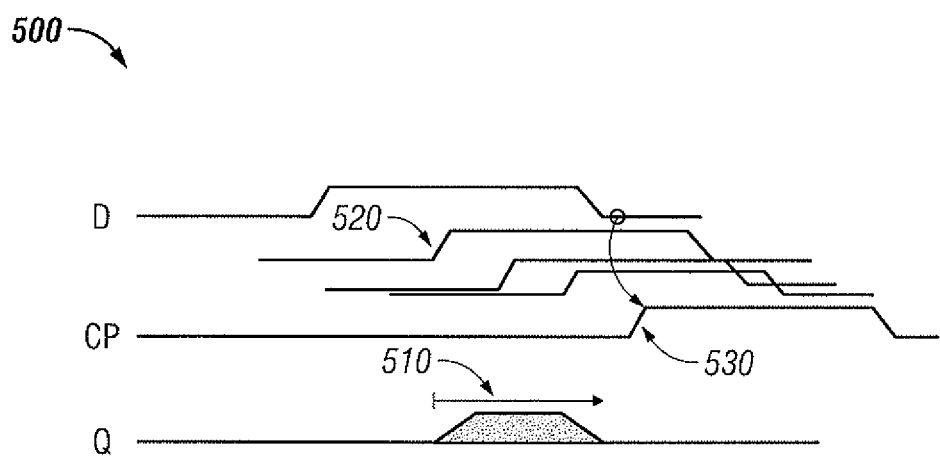
FIG. 5 illustrates a timing diagram for training a spare coarse delay and a functional coarse delay, in accordance with the disclosed embodiments.

FIG. 4 illustrates a detailed flow chart of operations illustrating logical steps of a method 400 for tracking and updating the PVT variation effects, in accordance with the disclosed embodiments. Note that in FIGS. 1-5, identical or similar blocks are generally indicated by identical reference numerals. The functional coarse delay depicted as CRSE_LOW in FIG. 1 can be in the functional path, and the spare coarse delay, depicted as CRSE_SPR in the spare path can be considered for tracking and updating the PVT variation effects. The training algorithm can be performed by determining a quarter setting for a spare fine delay 160 as calibrated through the functional coarse delay 120, as illustrated at block 410.

The multiplexers 140 can be configured so that the clock through the SPR fine delay 160 comes from the functional coarse delay (CRSE_LOW) 120. Note that a training procedure and associated configurations such as those shown and described in U.S. Pat. No. 7,571,396 and U.S. Pat. No. 7,454,303 can be utilized in accordance with the disclosed embodiments. U.S. Pat. No. 7,571,396 entitled "System and Method for Providing Swap Path Voltage and Temperature Compensation," which issued to Hughes et al on Aug. 4, 2009 is incorporated herein by reference. U.S. Pat. No. 7,454,303 entitled "System and Method for Compensating for PVT Variation Effect of the Delay Line of a Clock Signal," which issued to Magee et al on Nov. 18, 2009 is also incorporated herein by reference. Both U.S. Pat. No. 7,571,396 and U.S. Pat. No. 7,454,303 are assigned to LSI Corporation of Milpitas, Calif., U.S.A.

As described in U.S. Pat. No. 7,571,396 and U.S. Pat. No. 7,454,303, the fine delays of FIG. 1 herein can be trained such that the a 1x_inject signal will arrive at the D and CP pins of the endpoint flops at the same time. These delay settings are called the Align settings. The 1x_inject_90 strobe is now passed through the clock paths via the DQS mux 110. Line 520 in FIG. 5, for example, indicates that the CP on each flip-flop is approximately one-quarter cycle delayed relative to the data path arriving at D. This is consistent with the training procedure described in U.S. Pat. No. 7,571,396 and U.S. Pat. No. 7,454,303.

(NOTE: The following is where we deviate from U.S. Pat. No. 7,571,396 and U.S. Pat. No. 7,454,303). The Spare and Functional fine delays are set to their P cutoff delay. The coarse delay can be incremented until the sampled data transitions at one or more of the endpoint flip-flops in FIG. 1 transitions from sampling high (as indicated by line 520 of FIG. 5) to sampling low (as indicated by line 530 of FIG. 5). The fine delays can be returned to zero in order to return the sampling values from low to high. This is guaranteed because equation 3 ensures that the cutoff delay is always greater than a coarse delay increment. In similar fashion to the referred patents, the fine delays are incremented until a high to low transition is detected again, on all sampled data.

The combined delay of the Functional Coarse and the functional fine less the Functional Aligned delay setting is equal to a quarter cycle delay. Similarly, the combined delay of the Functional Coarse and the spare fine less the Spare Aligned delay setting is equal to a quarter cycle delay. A second quarter setting for the spare fine delay 160 can be determined as calibrated through spare coarse delay, as depicted at block 420. The training can be repeated with the multiplexers 140 configured so that the clock through the SPR fine delay 160 comes from the spare coarse delay 130 (CRS-E_SPR).

The spare fine delay 160 with respect to functional coarse delay 120 can be subtracted from the spare fine delay 160 with respect to spare coarse delay 130 in order to determine the coarse delay difference in fine delay steps between the functional coarse delay 120 and the spare coarse delay 130, as indicated at block 430. The difference may be due to the effect of process variation plus any internal deviation of each delay's physical makeup. For example, consider Sf(t) which represents the delay setting for the spare fine delay less align value as calibrated through a functional (CRSE_LOW) coarse delay at time t and Sc(t) represents the delay setting for the spare fine delay less align value as calibrated through the CRSE_SPR at time t. The coarse delay difference can be calculated at time 0 as follows:

$$Sdiff(0)=Sc(0)-Sf(0) \qquad (6)$$

The ratio of a functional fine delay to the spare fine delay calibrated through the functional coarse delay can be calculated, as illustrated at block 440. The ratio can be calculated for each functional fine delay cell by dividing the functional fine delay cells' delay setting less its align setting into the spare fine delay cells' setting less it's align setting. A ratio value other than 1.0 reflects any difference between each delay cell and the spare delay cell. The difference may be due to the effect of process variation plus any intentional deviation of each functional delay from a ¼ cycle delay. An intentional deviation includes manually changing the functional fine delay to compensate for external skew on DQ relative to DQS. Consider Qf(0) to be the functional fine delay through functional course, less the functional align value after training, at time 0. The ratio of spare to functional is indicated by equation (7) below:

$$R=Sc(0)/Qf(0) \qquad (7).$$

Therefore during tracking at time t, the new functional fine delay can be calculated as indicated by equation (8) below:

$$Qf(t)=Sf(t)/R \qquad (8)$$

To calculate Sf(t) we can calculate Sc(t) through the Spare Coarse delay and subtract Sdiff(0).

Thereafter, the training can be executed through the spare path in the functional mode for tracking the PVT variation, as depicted at block 450. The training for calibrating spare fine delay 160 through the spare coarse delay 130 can be repeated overtime in order to generate various results for the spare fine delay Sc(t) 160, as indicated at block 460. The spare fine delay of Sf(t) can be calculated via the formulation of equation (9) as follows:

$$Sf(t)=Sc(t)-Sdiff(0) \qquad (9)$$

The update for each functional fine delay can be calculated utilizing coarse delay difference (e.g., see equation 6), the calculated ratio for said functional delay (e.g., see equation 7) and the spare fine delay 160 calibrated via spare coarse delay 130, as illustrated at block 470. Note that block 407 describes a step for calculating a required update for each functional fine delay utilizing the coarse delay difference, calculated ratios, and the spare fine delay calibrated via the spare coarse delay. Such an approach compensates for PVT variation of the combination of the coarse bulk delay and the fine delay. The coarse delay settings will remain fixed and the fine delay will be updated to compensate for an VT variation to the coarse plus fine delay.

It will be appreciated that variations of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A computer-implemented method for delaying a data strobe, said method comprising:
   initializing via at least one computer, a common coarse delay and a fine delay to a quarter-cycle delay for shifting a read output data queue strobe associated with a memory device in order to sample a read output data queue within a physical layer;
   determining via said at least one computer, an optimum delay size of said coarse delay and said fine delay based on an application slowest frequency of operation in order to preserve said fine delay accuracy; and
   training via said at least one computer, said common coarse delay in association with said fine delay in order to thereafter update said fine delay to monitor and process, voltage, and temperature variation effect, wherein determining via said at least one computer, said optimum delay size of said coarse delay and said fine delay, further comprises:
      determining a minimum delay required in said fine delay to address voltage and temperature compensation in order to thereafter add said minimum delay to a course increment delay for determining a cutoff point;
      setting at least one cutoff tap based on a fast process corner so that said cutoff delay is at least one coarse increment greater than said minimum delay; and
      determining a fine delay limit by summing said minimum delay to said cutoff point in order to calculate a size of said common coarse delay.

2. The method of claim 1 further comprising programming via said at least one computer, said fine delay from said minimum delay to a maximum delay with fixed linear increments at each delay step in order to determine a resolution and accuracy of said delay.

3. The method of claim 1 further comprising bypassing via said at least one computer, said coarse delay at higher frequency and employing said fine delay for delaying said data strobe.

4. The computer implemented method of claim 1 wherein training said common coarse delay in association with said fine delay, further comprising:
   determining a quarter setting for a spare fine delay as calibrated through a functional coarse delay in order to thereafter determine a quarter setting for said spare fine delay as calibrated through a spare coarse delay;
   subtracting said spare fine delay with respect to said functional coarse delay from said spare fine delay with respect to said spare coarse delay in order to determine a coarse delay difference in fine delay steps for capturing delay difference between said functional coarse delay and said spare coarse delay; and calculating a ratio of said functional fine delay to said spare fine delay calibrated through said functional coarse delay.

5. The computer implemented method of claim 4 further comprising executing via said at least one computer, said training only through said spare path in said functional mode for tracking said process, voltage, and temperature variation.

6. The computer implemented method of claim 4 further comprising:

repeating training via said at least one computer for calibrating said spare fine delay through said spare coarse delay in order to generate various results for said spare fine delay; and calculating via said at least one computer, an update for each functional fine delay utilizing said coarse delay difference between functional coarse delay and spare coarse delay, the calculated ratios between functional fine delays and spare fine delays and said generated spare fine delay calibrated via said spare coarse delay.

7. The computer implemented method of claim 1 further comprising configuring via said at least one computer, said common coarse delay to achieve a bulk of said delay with minimum area overhead and said fine delay are smaller and provide said accuracy.

8. The computer implemented method of claim 1 wherein said common coarse delay possesses a large delay step with no requirement for a linear continuity of delay increments from said fine delay to said coarse delay in order to greatly simplify the construction of said combined delay.

9. A non-transitory computer-readable medium having computer-executable instructions to be executed by a computer for performing a method for delaying a data strobe, said method comprising:

initializing a common coarse delay and a fine delay to a quarter-cycle delay for shifting a read output data queue strobe associated with a memory device in order to sample a read output data queue within a physical layer;

determining an optimum delay size of said coarse delay and said fine delay based on an application slowest frequency of operation in order to preserve said fine delay accuracy; and training said common coarse delay in association with said fine delay in order to thereafter update said fine delay to monitor and process, voltage, and temperature variation effect, wherein determining said optimum delay size of said coarse delay and said fine delay further comprises:

determining a minimum delay required in said fine delay to address voltage and temperature compensation in order to thereafter add said minimum delay to a course increment delay for determining a cutoff point;

setting at least one cutoff tap based on a fast process corner so that said cutoff delay is at least one coarse increment greater than said minimum delay; and determining a fine delay limit by summing said minimum delay to said cutoff point in order to calculate a size of said common coarse delay.

10. The non-transitory computer-readable medium of claim 9 wherein said method further comprises programming said fine delay from said minimum delay to a maximum delay with fixed linear increments at each delay step in order to determine a resolution and accuracy of said delay.

11. The non-transitory computer-readable medium of claim 9 wherein said method further comprises bypassing said coarse delay at higher frequency and employing said fine delay for delaying said data strobe.

12. The non-transitory computer-readable medium of claim 9 wherein training said common coarse delay in association with said fine delay, further comprises:

determining a quarter setting for a spare fine delay as calibrated through a functional coarse delay in order to thereafter determine a quarter setting for said spare fine delay as calibrated through a spare coarse delay;

subtracting said spare fine delay with respect to said functional coarse delay from said spare fine delay with respect to said spare coarse delay in order to determine a coarse delay difference in fine delay steps for capturing delay difference between said functional coarse delay and said spare coarse delay; and calculating a ratio of said functional fine delay to said spare fine delay calibrated through said functional coarse delay.

13. The non-transitory computer-readable medium of claim 12 wherein said method further comprises executing said training only through said spare path in said functional mode for tracking said process, voltage, and temperature variation.

14. The non-transitory computer-readable medium of claim 12 wherein said method further comprises:

repeating training for calibrating said spare fine delay through said spare coarse delay in order to generate various results for said spare fine delay; and calculating an update for each functional fine delay utilizing said coarse delay difference between functional coarse delay and spare coarse delay, the calculated ratios between functional fine delays and spare fine delays and said generated spare fine delay calibrated via said spare coarse delay.

15. The non-transitory computer-readable medium of claim 9 wherein said method further comprises configuring said common coarse delay to achieve a bulk of said delay with minimum area overhead and said fine delay are smaller and provide said accuracy.

16. The non-transitory computer-readable medium of claim 9 wherein said common coarse delay possess a large delay step with no requirement for a linear continuity of delay increments from said fine delay to said coarse delay in order to greatly simplify the construction of said combined delay.

17. A system for delaying a data strobe, said system comprising:

means for initializing a common coarse delay and a fine delay to a quarter-cycle delay for shifting a read output data queue strobe associated with a memory device in order to sample a read output data queue within a physical layer;

means for determining an optimum delay size of said coarse delay and said fine delay based on an application slowest frequency of operation in order to preserve said fine delay accuracy; and means for training said common coarse delay in association with said fine delay in order to thereafter update said fine delay to monitor and process, voltage, and temperature variation effect, wherein said means for determining said optimum delay size of said coarse delay and said fine delay, further comprises:

means for determining a minimum delay required in said fine delay to address voltage and temperature compensation in order to thereafter add said minimum delay to a course increment delay for determining a cutoff point;

means for setting at least one cutoff tap based on a fast process corner so that said cutoff delay is at least one coarse increment greater than said minimum delay; and means for determining a fine delay limit by summing said minimum delay to said cutoff point in order to calculate a size of said common coarse delay.

18. The system of claim 17 wherein said common coarse delay possesses a large delay step with no requirement for a linear continuity of delay increments from said fine delay to said coarse delay in order to greatly simplify the construction of said combined delay.

* * * * *